United States Patent [19]

Towlson

[11] Patent Number: 5,653,918
[45] Date of Patent: Aug. 5, 1997

[54] FLEXIBLE THICK FILM CONDUCTOR COMPOSITION

[75] Inventor: Simon Martin Towlson, Avon, United Kingdom

[73] Assignee: E. I. Du Pont de Nemours and Company, Wilmington, Del.

[21] Appl. No.: 584,624

[22] Filed: Jan. 11, 1996

[51] Int. Cl.$^6$ .................................. H01B 1/22; H01B 1/24
[52] U.S. Cl. .................. 252/514; 252/510; 252/511; 524/439; 524/495; 106/1.18
[58] Field of Search ................... 252/510, 511, 252/512, 513, 514, 518; 524/439, 495; 106/1.18, 904

[56] References Cited

U.S. PATENT DOCUMENTS

| | | | |
|---|---|---|---|
| 4,348,496 | 9/1982 | Puhe et al. | 524/127 |
| 4,371,459 | 2/1983 | Nazareuko | 252/514 |
| 4,552,690 | 11/1985 | Ikeguchi et al. | 252/512 |
| 4,595,605 | 6/1986 | Martin et al. | 427/96 |
| 5,089,173 | 2/1992 | Freutzel et al. | 252/514 |

*Primary Examiner*—Douglas J. McGinty
*Assistant Examiner*—Mark Kopec

[57] ABSTRACT

Highly flexible and mechanically robust screen-printable conductor composition containing a) a conductive phase comprising Ag, Au, Cu, Ni, Pd, Pt, C or graphite and mixtures thereof dispersed in a polymer solution containing b) a terpolymer of polyvinyl acetate, vinyl chloride and a polar component dissolved in a volatile solvent.

9 Claims, No Drawings

FLEXIBLE THICK FILM CONDUCTOR COMPOSITION

FIELD OF THE INVENTION

The invention is directed to improved thick film conductor compositions and in particular to such compositions which are highly durable and flexible for use in making membrane touch switches.

BACKGROUND OF THE INVENTION

Polymeric thick film inks consist of particles containing conductive materials dispersed in an organic vehicle or medium containing volatile solvent and a polymeric resin. After screen-printing the composition is dried typically by heating at temperatures of up to 150° C. where the organic solvent is dried-off.

The conductive material is responsible for imparting to the thick film material the desired level of conductivity. This is normally limited to more than 0.01 Ohm/sq/mil. The conductive particles consist of typically silver metal for high conductivity and good resistance to oxidation and can be found in flake and/or non-flake morphologies.

After drying, the polymeric resin's primary function is to bind together the conductive particles to form an electrically conductive circuit pattern. Additionally, the binder system is required to impart the necessary adhesion to the desired substrate. In the case of flexible substrates which may or may not be surface treated, thermoplastic binder systems are typically employed. In general, these consist of polyesters, acrylics, vinyl or polyurethane polymers and may be combined to obtain optimum properties.

Furthermore, the resinous component is also responsible for providing the conductor composition with the required surface hardness, resistance to environmental changes and flexibility.

Historically, linear polyester, acrylic or vinyl copolymer-based resins have been typically used as the polymeric binder for general purpose membrane switch conductor pastes, having reasonably good abrasion resistance, chemical resistance, heat stability and flexibility. Other types of resins such as polyhydroxyethers (UCAR Phenoxy Resins) have also been utilized for higher degrees of abrasion resistance though normally higher drying temperatures are required (140°–150° C.). Polyurethane resins have also been utilized where surface hardness is not as important but a high degree of flexibility is needed on difficult surfaces such as rubber or polyethylene which is very smooth.

Thermoset polymeric compositions such as epoxy or phenolic resin have been commonly employed in polymeric thick film inks for rigid substrates. For these applications cross-linking polymers are preferred to ensure a high degree of hardness/abrasion resistance and heat stability (e.g., during soldering) on, for example, printed circuit boards.

The solvent system is required to primarily dissolve the polymeric resin system as well as adequately wet the substrate during the screen-printing operation. Additives may also be employed to fine-tune viscosity for good screen printing characteristics enabling accurate and reproducible production, or to modify the binder system acting as, for example, a plasticizer to enhance flex properties.

Present and future technology required for membrane touch switches is focused on 1) providing lower thick film raw material costs (reduced conductive metal loadings per unit conductivity), 2) lower substrate costs, 3) reducing operating costs (i.e., higher throughput capability), 4) increased durability to harsh environmental changes, 5) reliable usage at high working temperatures (e.g., up to 105° C.), 6) increased surface hardness for resistance to repeated high pressure electrical connector actuations, and 7) adequate conductor flexibility in order to ensure conductive stability after both the creasing and folding operations encountered during construction as well as repeated stretching and bending deformations during the life of a switch.

Prior art attempts at such compositions, such as U.S. Pat. No. 4,595,605 discloses an invention relating to conductive compositions which are solderable and flexible and that can be bonded directly to substrates. These compositions are made up from silver flake and vinyl chloride/vinyl acetate copolymer. Once cured the compositions demonstrate good adhesion, solderability and flexibility characteristics. Additionally, these compositions are capable of being soldered by non-silver bearing solder.

Other attempts at compositions are described in U.S. Pat. No. 5,089,173 which discloses an invention relating to a conductive composition comprising at least one thermoplastic vinyl chloride/vinyl acetate/dicarboxylic acid multipolymer resin; a second thermoplastic resin selected from the group consisting of at least one thermoplastic urethane resin; at least one thermoplastic polyester resin; or at least one thermoplastic polyurethane and at least one thermoplastic polyester resin; a tertiary amine; and an effective amount of at least one organic solvent and silver flake.

When the mixture of multipolymer resin or resins with the polyurethane or polyester resin or resins are thermally cured, it is believed that the unexpected high conductivity of the cured product results from a reaction of tertiary amine with the acid groups in the multipolymer, causing the formation of ionic groups in the cured resin system. The presence of these ionic groups are believed to cause the desired conductivity.

The present invention differs in that the terpolymer consists of vinyl chloride/vinyl acetate/vinyl alcohol or modified vinyl alcohol and gives more stable compositions.

The present invention relates primarily to the polymeric component of the conductor composition to provide enhanced properties in terms of those cited in 6) and 7) hereinabove which would be perceived as performance benefits for the membrane switch manufacturer. In this respect, the vinyl alcohol or hydroxyalkyl acrylate components of the vinyl terpolymer system of the present invention are thought to be playing a beneficial role, especially on non-print treated substrates. In the second instance, the invention relates to providing possibilities for cost reduction for the membrane switch manufacturer through use of conductor pastes with reduced metal loadings. This invention extends itself beyond silver and includes carbon/graphite/silver and carbon/graphite particles for conductors which reduce costs. In the third instance, the invention relates to providing possibilities for the membrane switch producer to reduce raw material cost through use of cheaper substrates such as non-print treated polyester.

The invention relates to a highly durable and flexible screen-printable conductor composition which is useful for making membrane touch switches and shielding applications. The invention is primarily directed at applications requiring high degrees of elasticity to withstand deformational stresses involved during repeated keyboard pad attuations. In particular, the carbon/graphite composition has typically higher abrasion compared to the silver compositions.

The invention possesses a high degree of mechanical robustness or durability as characterized by abrasion resistance (using pencil hardness test) as well as a high degree of flexibility resulting in reduced loss of conductivity (<two times initial resistance) after creasing.

SUMMARY OF THE INVENTION

The invention is directed to a thick film conductor composition comprising by weight, basis total composition:

(a) 40–80% conductive metal wherein the metal is selected from the group consisting of Ag, Au, Cu, Ni, Pd and Pt and mixtures and alloys thereof;

(b) 4–18% terpolymer wherein the terpolymer is selected from the group consisting of vinyl chloride and vinyl acetate and polar-type component dissolved in (c) organic solvent.

The invention is further directed to compositions wherein the conductive phase hereinabove may be 35–60 wt % admixture of carbon, graphite and silver or 7–15 wt % admixture of carbon and graphite or carbon or graphite.

DETAILED DESCRIPTION OF THE INVENTION

A. Finely Divided Conductive Particles

The invention can be used effectively in screen printable thick film pastes utilizing all types of finely divided conductive particles. The electric functionality of the particles does not itself affect the ability of the invention to overcome problems associated with printability, shrinkage and cracking. Thus, the invention is applicable to polymeric thick film conductive pastes in which the conductive material is a base or noble metal. For example, suitable conductive metals include Pd, Ag, Au, Pt, Cu, Ni and mixtures and alloys thereof. The preferred metal is Ag in spherical or flake form. Typically, 40–80 wt %, basis total composition of the conductive metal is found in the composition. The preferred amount is 50–75 wt %. Also, the invention extends to non-electrically functional pastes, such as flexible, screen printable dielectrics. Further, carbon/graphite or carbon/graphite/silver systems are very suitable for use in the invention.

The particle size distribution of the metal particles is not itself critical with respect to the effectiveness of the invention. But, as a practical matter, it is preferred that the particle size of the particles be in the range of 0.1–10 microns and preferably 0.5–5 microns.

The composition may contain conductive fillers such as carbon black, graphite and the like in a filler to binder weight ratio of about 50/100 to 300/100 or 8–40 wt. % based on total composition to provide an electrically conductive track or pad.

Typically, it has been found that a combination of both carbon and graphite is necessary to achieve lowest resistivity at low viscosity but each could be used independently. Also, an admixture of carbon, graphite and silver may be used. The preferred grade of carbon black is the Vulcan XC-72 from Cabot with a surface area of 250 $m^2/g$. Other carbon blacks with lower surface area which may be used in the present invention are Monarch 700 (200 $m^2/g$) and Monarch 120 (20–25 $m^2/g$), both from Cabot. The surface area of carbon black can typically range from 20 to 300 $m^2/g$ where the higher surface area carbon blacks generally are more conductive. The preferred graphite is HPN-10 from Cabot. When the admixture of carbon and graphite is used, typically, 7–15 wt % is found in the composition. When the admixture carbon, graphite and silver is used 35–60 wt % is found in the composition with 35–50 wt % the preferred range.

B. Organic Vehicle

The main purpose of the organic vehicle is to disperse finely divided particles of the composition in such form that it can readily be applied to a flexible or other substrate. Thus, the organic vehicle must first of all be one in which the particles are dispersible with an adequate degree of stability. Secondly, the rheological properties of the organic vehicle must be such that they lend good application properties to the dispersion.

The organic vehicle for most thick film compositions is typically a solution of polymer in a solvent and, frequently, a solvent solution containing both polymer and thixotropic agents for rheology enhancement. Optionally, other dissolved materials such as plasticizers, emulsifiers, wetting agents and dispersing aids may be added.

Most thick film compositions are applied to a substrate by means of screen printing. Therefore, they must have appropriate viscosity so they can be passed through the screen readily. In addition, they should be thixoptropic in order that they set up rapidly after being screen printed, thereby giving good resolution. For thick film compositions suitable for high speed printing, the relaxation rate constant ($k_r$) for the paste is 0.01–0.1 and preferably 0.025–0.05. Paste $k_r$ values of 0.025 are considered optimum for most pastes which are screen printed rapidly, while $k_r$ values of 0.04 are considered optimum for most pastes which are used in very high resolution applications. The organic vehicle is preferably formulated also to give appropriate wettability of the particles and the substrate, good drying rate, dried film strength sufficient to withstand rough handling. Satisfactory appearance of the dried composition is also important.

Solvents suitable for the present invention must dissolve the polymer. The solvents listed hereafter may be used in the invention: propylene glycol monomethyl ether acetate, methyl propasol acetate, 1-methoxy-2 propanol acetate, methyl cellosolve acetate, butyl propionate, primary amyl acetate, hexyl acetate, cellosolve acetate, pentyl propionate, diethylene oxalate, dimethyl succinate, dimethyl glutarate, dimethyl adipate, methyl isoamyl ketone, methyl n-amyl ketone, cyclohexanone, diacetone alcohol, diisobutyl ketone, n-methyl pyrolidone, butyrolactone, isophorone, methyl n-isopropyl ketone. Various combinations of these and other solvents are formulated to obtain the desired viscosity and volatility requirements for each application.

The constituents of the terpolymer utilized in the invention and ratio thereof play the following role.

Copolymerization of vinyl chloride with a vinyl acetate component gives the copolymer adequate flexibility for coating applications. Also, the vinyl copolymer is soluble in a range of solvents and, therefore, viable solution coatings can be prepared.

The unmodified vinyl chloride/acetate copolymer is known in the coatings industry for high cohesive strength but offers poor adhesion which has restricted its applicability. Presence of a third polar-type component is important to increase adhesion on a wide variety of substrates (polymers, metals, and metal oxides). As used herein "polar-type component" refers to a polymer with reactive hydroxyl or modified hydroxyl sites. The preferred polar-type components used herein are vinyl alcohol and hydroxyalkyl acrylate.

Preferred polymeric resin content is typically between 4 and 18 wt % of wet paste. A resin content below 4% may result in too low viscosities for screen printing for adequate definition, particularly if the silver content is also at a low level (i.e., 40–60%). Lowering the polymer content effectively lowers mid and high shear viscosities (10/50 rpm) but low shear (0.5 rpm) is largely dictated by the conductor material. There may also be a loss in mechanical properties i.e., abrasion resistance. It has been observed that in some compositions a decrease in polymer loading will increase the amount of conductor taken off with the tape during the Scotch 600 tape test. This is seen as surface residue on the tape which constitute silver particles from the surface of the conductor track. Alternatively, too high polymer content (>18%) will tend to result in paste compositions with too high mid/high shear viscosities which may make screening difficult. Too high resin content will also result in higher resistivity which is due to the higher volume occupied by the polymer vs. silver. 18% wt. polymer roughly equates to 70% volume of polymer which if exceeded is accompanied by an exponential rise in resistivity.

With the intention of developing cheaper conductor pastes per unit conductivity, several compositions were prepared using lower loadings of silver metal down to around 40%. For these experiments, compositions contained several solvent systems as well as varying polymer loadings were used to adjust viscosity. The preferred loading of vinyl acetate in the terpolymer of the invention should typically lie in the range of 1–15 wt. % basis total weight of the terpolymer. The preferred loading of polar-type component should lie within the range of 0.5–20 wt. % basis total weight of the terpolymer.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic vehicle to particles in the dispersions can vary considerably and depends upon the manner in which the dispersion is to be applied and the kind of organic vehicle used. Normally, to achieve good coverage, the dispersions will contain complementarily by weight 50–90% particles and 50–10% organic vehicle. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (sec $^{-1}$) | Viscosity (Pa.s) |
| --- | --- |
| 0.2 | 50–5000 - |
|  | 50–2000 Preferred |
|  | 50–1000 Most Preferred |
| 4 | 5–400 - |
|  | 10–200 Preferred |
|  | 10–50 Most Preferred |
| 20 | 4–40 - |
|  | 4–20 Preferred |
|  | 4–18 Most Preferred |

The amount of organic vehicle utilized is determined mainly by the final desired formulation viscosity and print thickness.

Description of Tests

A. Resistance

This test is designed to measure the resistivity of certain conductor compositions on a Mylar® substrate.
Procedure
1. Mix the sample thoroughly to assure uniform consistency.

2. Print 5 parts on the specified grade of 2"×3" Mylar® using screen K-9 (806☐, 325 mesh, 1.1 mil epoxy emulsion, DuPont No. 7070). Some compositions also call for testing an approved standard along with the sample.
3. Dry as specified on the test sheet.
4. Measure the print thickness in micrometers on the surfanalyzer.
5. Measure the resistance of the 806☐ pattern.
6. Calculate the resistivity corrected to a print thickness of 25 μm as follows:

$$\text{Resistivity} = \frac{\text{Avg. Measured Resist.} \times \text{Avg. Thick. (μm)}}{806 \times 25}$$

7. Record all data on test sheet.

B. Crease Resistance

This test is designed to measure the change in resistivity of the conductor compositions on a Mylar® substrate upon bending of the printed film.
Procedure
1. Using the same procedure as described in G-1.2.8, determine the resistivity of the sample.
2. Fold the printed substrate to a 180° angle. The metal-containing surface should be inside. Pinch or press—do not crease. Creasing is carried out using a 2 Kg roll bar.
3. Fold it in the opposite direction, that is, the metal surface outside. Pinch or press—do not crease.
4. Straighten it out and immediately measure its resistivity.

NOTE: If after straightening the substrate, it is allowed to sit to a while before measuring resistivity, the value obtained will approach the value for the non-folded film.

5. Calculate and report resistivity as in G-1.2.8.

C. Abrasion Resistance

Determine the film hardness of silver conductor compositions printed on Mylar® substrates.
Procedure 1. Mix the sample thoroughly to assure uniform consistency. 2. Print and dry as in G-1.2.8. 3. Use acceptable brand of pencils(2) with calibrated lead—hardness. The commonly used scale for pencil hardness is:

$$\overline{6B\ 5B\ 4B\ 3B\ 2B\ B\ HBH\ 2H\ 3H\ 4H\ 5H\ 6H\ 7H\ 8H\ 9H} > \text{Hard}$$

4. If wood pencils are used they should be sharpened to get a smooth cylinder of lead. Holding the pencil or lead holder at an angle of 90 to an abrasive paper (grit No. 90), rub the lead against the paper until a flat, smooth and circular cross section is obtained, free of chips and nicks on the edges. 5. Starting with the hardest lead, hold the pencil firmly with the lead against the film at a 45° angle (point away from the operator) and push away from the operator. Use a fresh edge on the lead before every test. 6. Repeat this process down the hardness scale until a pencil is found that will not cut through the film to the substrate. A failure is defined as 4 or more broken lines out of the 10 lines of the pattern. 7. Report as: Harder than "__" softer than or equal to "__".

(1) Jurisdiction of ASTM Committee D-1 on Print and Related Coating Materials.
(2) These are: a) Eberhard—Microtronic and b) Eagle turquoise—T2375.

The present invention will be described in further detail by giving practical examples. The scope of the present invention, however, is not limited in any way by these practical examples.

EXAMPLES

Test results for all Examples are given in Table 1. All pastes were printed and tested as stated in Example 1.

Example 1

A mixture of 25 g Vinyl chloride/vinyl acetate/vinyl alcohol (90/4/6) terpolymer (UCAR VAGH from Union Carbide) and 75 g 4-butyrolactone was stirred until the resin had completely dissolved (ca.24 hours). A 300 g silver paste was then prepared by mixing 195 g of silver flake in 105 g of the above-mentioned polymer/solvent mixture resulting in the following composition:

|  | wt. % |
| --- | --- |
| Silver Flake | 65.0 |
| Vinyl chloride/vinyl acetate/vinyl alcohol (90/4/6) polymer | 8.75 |
| 4-butyrolactone | 26.25 |

The paste was mixed in a planetary mixer for 15 minutes and subsequently passed over a triple-roll mill three times at various pressure settings to give a fully dispersed silver paste.

The paste composition was printed on Autotype HU5 non-print treated 5 mil polyester film through a 325 mesh, stainless steel epoxy emulsion screen. The printed parts were dried to form the switching element in a laboratory air circulating oven at 120° C. for 10 minutes. The resultant switching element was tested for resistivity, both before and after creasing as well as abrasion resistance and adhesion (using cellophane tape sold as either Scotch 810 and Scotch 600).

Example 2

A mixture of 25 g Vinyl chloride/vinyl acetate/hydroxyalkyl acrylate (81/4/15) terpolymer (UCAR VAGF from Union Carbide) and 75 g 4-butyrolactone was stirred until the resin had completely dissolved (ca.24 hours). A 300 g silver paste was then prepared by mixing 195 g of silver flake in 105 g of the above-mentioned polymer/solvent mixture resulting in the following composition:

|  | wt. % |
| --- | --- |
| Silver Flake | 65.0 |
| Vinyl chloride/vinyl acetate/hydroxyalkyl acrylate polymer | 8.75 |
| 4-butyrolactone | 26.25 |

The paste was mixed in a planetery mixer for 15 minutes and subsequently passed over a triple-roll mill three times at various pressure settings to give a fully dispersed silver paste.

Example 3

A mixture of 25 g Vinyl chloride/vinyl acetate/vinyl alcohol (90/4/6) terpolymer (UCAR VAGH from Union Carbide) and 37.5 g 4-butyrolactone and 37.5 g 1-methoxy-2-propanol acetate was stirred until the resin had completely dissolved (ca.24 hours). A 300 g silver paste was then prepared by mixing 195 g of silver flake in 105 g of the above-mentioned polymer/solvent mixture.

The paste was mixed in a planetery mixer for 15 minutes and subsequently passed over a triple-roll mill three times at various pressure settings to give a fully dispersed silver paste. Finally 12.5 g 4-butyrolactone and 12.5 g 1-methoxy-2-propanol acetate were added as thinners resulting in the following composition:

|  | wt. % |
| --- | --- |
| Silver Flake | 60.0 |
| Vinyl chloride/vinyl acetate/vinyl alcohol polymer | 8.1 |
| 4-butyrolactone | 15.95 |
| 1-methoxy-2-propanol acetate | 15.95 |

Example 4

A mixture of 25 g Vinyl chloride/vinyl acetate/hydroxyalkyl acrylate (81/4/15) terpolymer (UCAR VAGF from Union Carbide and 37.5 g 4-butyrolactone and 37.5 g 1-methoxy-2-propanol acetate was stirred until the resin had completely dissolved (ca.24 hours). A 300 g silver paste was then prepared by mixing 195 g of silver flake in 105 g of the above-mentioned polymer/solvent mixture.

The paste was mixed in a planetery mixer for 15 minutes and subsequently passed over a triple-roll mill three times at various pressure settings to give a fully dispersed silver paste. Finally 12.5 g 4-butyrolactone and 12.5 g 1-methoxy-2-propanol acetate were added as thinners resulting in the following composition:

|  | wt. % |
| --- | --- |
| Silver Flake | 60.0 |
| Vinyl chloride/vinyl acetate/hydroxyalkyl acrylate polymer | 8.1 |
| 4-butyrolactone | 15.95 |
| 1-methoxy-2-propanol acetate | 15.95 |

Example 5

A mixture of 25 g Vinyl chloride/vinyl acetate/vinyl alcohol (90/4/6) terpolymer (UCAR VAGH from Union Carbide) and 37.5 g 4-butyrolactone and 37.5 g diethyl oxalate was stirred until the resin had completely dissolved (ca.24 hours). A 300 g silver paste was then prepared by mixing 195 g of silver flake in 105 g of the above-mentioned polymer/solvent mixture.

The paste was mixed in a planetery mixer for 15 minutes and subsequently passed over a triple-roll mill three times at various pressure settings to give a fully dispersed silver paste.

Finally 12.5 g 4-butyrolactone and 12.5 g diethyl oxalate were added as thinners resulting in the following composition:

|  | wt. % |
| --- | --- |
| Silver Flake | 60.0 |
| Vinyl chloride/vinyl acetate/vinyl alcohol polymer | 8.1 |
| 4-butyrolactone | 15.95 |
| diethyl oxalate | 15.95 |

Example 6

A mixture of 25 g Vinyl chloride/vinyl acetate/hydroxyalkyl acrylate (81/4/15) terpolymer (UCAR VAGF from Union Carbide) and 37.5 g 4-butyrolactone and 37.5 g diethyl oxalate was stirred until the resin had completely dissolved (ca.24 hours). A 300 g silver paste was then prepared by mixing 195 g of silver flake in 105 g of the above-mentioned polymer/solvent mixture.

The paste was mixed in a planetery mixer for 15 minutes and subsequently passed over a triple-roll mill three times at various pressure settings to give a fully dispersed silver paste. Finaly 12.5 g 4-butyrolactone and 12.5 g 1-methoxy-2-propanol acetate were added as thinners resulting in the following composition:

|  | wt. % |
|---|---|
| Silver Flake | 60.0 |
| Vinyl chloride/vinyl acetate/hydroxyalkyl acrylate polymer | 8.1 |
| 4-butyrolactone | 15.95 |
| diethyl oxalate | 15.95 |

Example 7 (Comparative)

A mixture of 25 g Vinyl chloride/vinyl acetate/(84/16) copolymer (UCAR VYHH from Union Carbide) and 75 g 4-butyrolactone was stirred until the resin had completely dissolved (ca.24 hours). A 300 g silver paste was then prepared by mixing 195 g of silver flake in 105 g of the above-mentioned polymer/solvent mixture resulting in the following composition:

|  | wt. % |
|---|---|
| Silver flake | 65.0 |
| Vinyl chloride/vinyl acetate (84/16) | 8.75 |
| 4-butyrolactone | 26.25 |

The paste was mixed in a planetery mixer for 15 minutes and subsequently passed over a triple-roll mill three times at various pressure settings to give a fully dispersed silver paste.

Example 8 (Comparative)

A mixture of 25 g Vinyl chloride/vinyl acetate/copolymer (Vilit AS47 from BF Goodrich) and 75 g 4-butyrolactone was stirred until the resin had completely dissolved (ca.24 hours). A 300 g silver paste was then prepared by mixing 195 g of silver flake in 105 g of the above-mentioned polymer/ solvent mixture resulting in the following composition:

|  | wt. % |
|---|---|
| Silver Flake | 65.0 |
| Vinyl chloride/vinyl acetate | 8.75 |
| 4-butyrolactone | 26.25 |

The paste was mixed in a planetery mixer for 15 minutes and subsequently passed over a triple-roll mill three times at various pressure settings to give a fully dispersed silver paste.

Example 9

A mixture of 25 g Vinyl chloride/vinyl acetate/vinyl alcohol (90/4/6) terpolymer (UCAR VAGH from Union Carbide) and 75 g 4-butyrolactone was stirred until the resin had completely dissolved (ca.24 hours). A 300 g silver paste was then prepared by mixing 150 g of silver flake in 150 g of the above-mentioned polymer/solvent mixture resulting in the following composition:

|  | wt. % |
|---|---|
| Silver flake | 50.0 |
| Vinyl chloride/vinyl acetate/vinyl alcohol polymer | 12.5 |
| 4-butyrolactone | 37.5 |

The paste was mixed in a planetery mixer for 15 minutes and subsequently passed over a triple-roll mill three times at various pressure settings to give a fully dispersed silver paste.

Example 10

A mixture of 25 g Vinyl chloride/vinyl acetate/hydroxyalkyl acrylate (81/4/15) terpolymer (UCAR VAGF from Union Carbide) and 75 g 4-butyrolactone was stirred until the resin had completely dissolved (ca.24 hours). A 300 g silver paste was then prepared by mixing 150 g of silver flake in 150 g of the above-mentioned polymer/solvent mixture resulting in the following composition:

|  | wt. % |
|---|---|
| Silver flake | 50.0 |
| Vinyl chloride/vinyl acetate/hydroxyalkyl acrylate polymer | 12.5 |
| 4-butyrolactone | 37.5 |

The paste was mixed in a planetery mixer for 15 minutes and subsequently passed over a triple-roll mill three times at various pressure settings to give a fully dispersed silver paste.

Example 11

A mixture of 25 g Vinyl chloride/vinyl acetate/vinyl alcohol (90/4/6) terpolymer (UCAR VAGH from Union Carbide) and 75 g 4-butyrolactone was stirred until the resin had completely dissolved (ca.24 hours). A 300 g silver paste was then prepared by mixing 150 g of silver flake in 120 g of the above-mentioned polymer/solvent mixture and 30 g of 4-butyrolactone resulting in the following composition:

|  | wt. % |
|---|---|
| Silver flake | 50.0 |
| Vinyl chloride/vinyl acetate/vinyl alcohol polymer | 10.0 |
| 4-butyrolactone | 40.0 |

The paste was mixed in a planetery mixer for 15 minutes and subsequently passed over a triple-roll mill three times at various pressure settings to give a fully dispersed silver paste.

Example 12

A mixture of 25 g Vinyl chloride/vinyl acetate/hydroxyalkyl acrylate (81/4/15) terpolymer (UCAR VAGF from Union Carbide) and 75 g 4-butyrolactone was stirred until the resin had completely dissolved (ca.24 hours). A 300 g silver paste was then prepared by mixing 150 g of silver flake in 120 g of the above-mentioned polymer/solvent mixture and 30 g of 4-butyrolactone resulting in the following recipe:

| | wt. % |
|---|---|
| Silver flake | 50.0 |
| Vinyl chloride/vinyl acetate/hydroxyalkyl acrylate polymer | 10.0 |
| 4-butyrolactone | 40.0 |

The paste was mixed in a planetary mixer for 15 minutes and subsequently passed over a triple-roll mill three times at various pressure settings to give a fully dispersed silver paste.

Example 13

A mixture of 25 g Vinyl chloride/vinyl acetate/vinyl alcohol (90/4/6) terpolymer (UCAR VAGH from Union Carbide) nd 37.5 g 4-butyrolactone and 37.5 1-methoxy-2-propanol acetate was stirred until the resin had completely dissolved (ca.24 hours). A 300 g silver paste was then prepared by mixing 150 g of silver flake in 120 g of the above-mentioned polymer/solvent mixture as well as 15 g 4-butyrolactone and 15 g 1-methoxy-2-propanol acetate.

The paste was mixed in a planetary mixer for 15 minutes and subsequently passed over a triple-roll mill three times at various pressure settings to give a fully dispersed silver paste according to the following recipe:

| | wt. % |
|---|---|
| Silver flake | 50.0 |
| Vinyl chloride/vinyl acetate/vinyl alcohol polymer | 10 |
| 4-butyrolactone | 20 |
| 1-methoxy-2-propanol acetate | 20 |

Example 14

A mixture of 25 g Vinyl chloride/vinyl acetate/hydroxyalkyl acrylate (81/4/15) terpolymer (UCAR VAGF from Union Carbide) and 37.5 g 4-butyrolactone and 37.5 1-methoxy-2-propanol acetate was stirred until the resin had completely dissolved (ca.24 hours). A 300 g silver paste was then prepared by mixing 165 g of silver flake in 135 g of the above-mentioned polymer/solvent mixture.

The paste was mixed in a planetary mixer for 15 minutes and subsequently passed over a triple-roll mill three times at various pressure settings to give a fully dispersed silver paste according to the following recipe:

| | wt. % |
|---|---|
| Silver flake | 55.0 |
| Vinyl chloride/vinyl acetate/hydroxyalkyl acrylate polymer | 11.25 |
| 4-butyrolactone | 16.875 |
| 1-methoxy-2-propanol acetate | 16.875 |

Example 15

A carbon-containing conductor was prepared in the same manner to the silver thick film compositions and tested as in example 1. A mixture of 25 g Vinyl chloride/vinyl acetate/vinyl alcohol (90/4/6) terpolymer (UCAR VAGH from Union Carbide) and 75 g 4-butyrolactone was stirred until the resin had completely dissolved (ca.24 hours). A 300 g paste sample was then prepared by mixing 30 g of carbon and 30 g of graphite in 190.8 g of the above-mentioned polymer/solvent mixture and 1.5 g of Duomeen surfactant and 47.7 g of 4-butyrolactone resulting in the following composition:

| | wt. % |
|---|---|
| HPN-10 Graphite | 10.0 |
| Vulcan XC-72 carbon (Cabot) | 10.0 |
| Vinyl chloride/vinyl acetate/hydroxyalkyl acrylate polymer | 15.9 |
| Duomeen TDO amine salt surfactant (Riverside Chemicals) | 0.5 |
| 4-butyrolactone | 63.6 |

The paste was mixed in a planetery mixer for 15 minutes and subsequently passed over a triple-roll mill three times at various pressure settings to give a fully dispersed paste.

Example 16

A carbon-containing conductor was prepared in the same manner to the silver thick film compositions and tested as in example 1. A mixture of 25 g Vinyl chloride/vinyl acetate/hydroxyalkyl acrylate (81/4/15) terpolymer (UCAR VAGF from Union Carbide) and 75 g 4-butyrolactone was stirred until the resin had completely dissolved (ca.24 hours). A 300 g paste was then prepared by mixing 30 g of carbon and 30 g of graphite in 190.8 g of the above-mentioned polymer/solvent mixture and 1.5 g of Duomeen surfactant and 47.7 g of 4-butyrolactone resulting in the following composition:

| | wt. % |
|---|---|
| HPN-10 Graphite | 10.0 |
| Vulcan XC-72 carbon (Cabot) | 10.0 |
| Vinyl chloride/vinyl acetate/hydroxyalkyl acrylate polymer | 15.9 |
| Duomeen TDO amine salt surfactant (Riverside Chemicals) | 0.5 |
| 4-butyrolactone | 63.6 |

The paste was mixed in a planetery mixer for 15 minutes and subsequently passed over a triple-roll mill three times at various pressure settings to give a fully dispersed paste.

Examples 17–20

Examples 20–23 were prepared by blending Examples 16 and 24 in varying ratios by mixing in a planetary mixer for 15 minutes to give a fully dispersed silver carbon paste conductor. These compositions may also be prepared by mixing and milling as in the standard procedure outlined in Example 1.

Example 17 (90%/10% Blend of Example 13/Example 21)

| | wt. % |
|---|---|
| HPN-10 Graphite | 1.01 |
| Vulcan XC-72 carbon (Cabot) | 1.01 |
| Silver Flake | 45.00 |
| Vinyl chloride/vinyl acetate/vinyl alcohol (90/4/6) polymer | 10.60 |
| 4-Butyrolactone | 24.38 |
| 1-Methoxy-2-propanol acetate | 18.0 |

Example 18 (80%/20% Blend of Example 13/
Example 21)

| | wt. % |
|---|---|
| HPN-10 Graphite | 2.02 |
| Vulcan XC-72 carbon (Cabot) | 2.02 |
| Silver Flake | 40.00 |
| Vinyl chloride/vinyl acetate/vinyl alcohol (90/4/6) polymer | 11.20 |
| 4-Butyrolactone | 28.76 |
| 1-Methoxy-2-propanol acetate | 16.0 |

Example 19 (70%/30% Blend of Example 13/
Example 21)

| | wt. % |
|---|---|
| HPN-10 Graphite | 3.02 |
| Vulcan XC-72 carbon (Cabot) | 3.02 |
| Silver Flake | 35.00 |
| Vinyl chloride/vinyl acetate/vinyl alcohol (90/4/6) polymer | 11.79 |
| 4-Butyrolactone | 33.15 |
| 1-Methoxy-2-propanol acetate | 14.02 |

Example 20 (60%/40% Blend of Example 13/
Example 21)

| | wt. % |
|---|---|
| HPN-10 Graphite | 4.02 |
| Vulcan XC-72 carbon (Cabot) | 4.02 |
| Silver Flake | 30.00 |
| Vinyl chloride/vinyl acetate/vinyl alcohol (90/4/6) polymer | 12.78 |
| 4-Butyrolactone | 37.53 |
| 1-Methoxy-2-propanol acetate | 11.65 |

Example 21

Carbon-containing conductor was prepared in the same manner (see below) as for the other carbon thick film compositions, this time for the purpose of blending with the silver conductor composition cited in Example 16 using varying ratios to obtain conductor compositions with silver contents of less than 50%. These blended materials were then tested in the same manner as the silver conductor compositions. The resulting compositions are listed below.

A mixture of 25 g vinyl chloride/vinyl acetate/vinyl alcohol (90/40/6) terpolymer (UCAR VAGH from Union Carbide) and 75 g 4-butyrolactone was stirred until the resin had completely dissolved (ca. 24 hours). A paste was then prepared by mixing 30 g of carbon and 30 g of graphite in 190.8 g of the above-mentioned polymer/solvent mixture and 47.7 g of 4-butyolactone resulting in the following recipe:

| | wt. % |
|---|---|
| HPN-10 Graphite | 10.05 |
| Vulcan XC-72 carbon (Cabot) | 10.05 |
| Vinyl chloride/vinyl acetate/vinyl alcohol (90/4/6) polymer | 15.98 |
| 4-Butyrolactone | 63.92 |

The paste was mixed in a planetery mixer for 15 minutes and subsequently passed over a triple-roll mill three times at various pressure settings to give a fully dispersed paste.

TABLE 1

| | Resistanc[1] (mΩ/□/mil) | Crease[2] Resistance (mΩ/□/mil) | Abrasion[3] Resistance |
|---|---|---|---|
| Example 1 | 10.5 | 20.3 | 7H |
| Example 2 | 18.4 | 22 | 7H |
| Example 3 | 11 | 16 | 3H |
| Example 4 | 8.3 | 11 | 5H |
| Example 5 | 13 | 17 | 5H |
| Example 6 | 12 | 14.4 | 5H |
| Example 7 | 17.4 | Open circuit | 4H |
| Example 8 | 22 | 50 | 2H |
| Example 9 | 17.9 | 18.3 | 6H |
| Example 10 | 52 | 65 | H |
| Example 11 | 11.7 | 18.7 | 5H |
| Example 12 | 21.2 | 26.6 | 4H |
| Example 13 | 13.6 | 22 | 6H |
| Example 14 | 14.5 | 16.5 | 4H |
| Example 17 | 12.7 | 15.3 | 6H |
| Example 18 | 28.3 | 30.1 | 6H |
| Example 19 | 67.1 | 76.3 | 6H |
| Example 20 | 164.0 | 225.0 | 6H |

| | Resistanc[1] (Ω/□/mil) | Crease[2] Resistance (Ω/□/mil) | Abrasion[3] Resistance |
|---|---|---|---|
| Example 15 | 20.5 | 21.0 | 5H |
| Example 16 | 20.4 | 22.0 | 4H |
| Example 21 | 21.8 | 23.0 | 6H |

Result Interpretation

1. Low resistivity (i.e. between 8–15 milliOhm/sq/mil or Ohm/sq/mil) for silver conductor compositions.

2. Good flexibility resulting in final resistivity values after creasing between 1 to 2 times those initial resistivity.

3. High surface hardness/abrasion resistance (i.e. between 3 and 7 H).

Examples 1–6 were also tested at reduced drying temperatures to assess performance where use of heat-sensitive substrates are of benefit. This time the compositions were dried at 80° C. for 10 mins in a laboratory box oven as before. At this reduced drying temperature the compositions gave comparable resistances (see Table 2) with only a slight trade-off in crease resistance and surface hardness.

TABLE 2

| | Resistance (mΩ/□/mil) | Crease Resistance (mΩ/□/mil) | Abrasion Resistance |
|---|---|---|---|
| Example 1 | 16 | 32 | 5H |
| Example 2 | 18 | 38 | 4H |
| Example 3 | 9 | 23 | 4H |
| Example 4 | 11.5 | 21 | 4H |
| Example 5 | 18 | 39 | 4H |
| Example 6 | 17 | 29 | 3H |

What is claimed is:

1. A thick film conductor composition comprising by weight, basis total composition:
   (a) 40–80% electrical conductive metal wherein the metal is selected from the group consisting of Ag, Au, Cu, Ni, Pd and Pt and mixtures and alloys thereof;
   (b) 4–18% terpolymer wherein the terpolymer is vinyl chloride, vinyl acetate and a third component selected from the group consisting of vinyl alcohol, and hydroxyalkyl acrylate dissolved in
   (c) organic solvent.

2. The composition of claim 1 wherein the vinyl acetate is ≦15% of the terpolymer.

3. The composition of claim 1 wherein the terpolymer comprises 1–15 wt % vinyl acetate, 0.5–20 wt % third component and 1.5–65 wt % vinyl chloride.

4. The composition of claim 1 further comprising a thixotropic agent.

5. A thick film composition comprising by weight, basis total composition:
   (a) 35–60% admixture of carbon black, graphite and silver;
   (b) 4–18% terpolymer wherein the terpolymer is vinyl chloride, vinyl acetate and a third component selected from the group consisting of vinyl alcohol, and hydroxyalkyl acrylate dissolved in
   (c) organic solvent.

6. A thick film composition comprising by weight, basis total composition:
   (a) 7–15% of an electrically conductive component selected from the group consisting of carbon black, graphite, and mixtures thereof;
   (b) 4–18% terpolymer wherein the terpolymer is vinyl chloride, vinyl acetate and a third component selected from the group consisting of vinyl alcohol, and hydroxyalkyl acrylate dissolved in
   (c) organic solvent.

7. The composition of claim 6 wherein the electrically conductive component is an admixture of carbon black and graphite.

8. The composition of claim 6 wherein the electrically conductive component is graphite.

9. The composition of claims 1, 5 or 6 wherein the organic solvent is selected from the group consisting of butyrolactone, 1-methoxy-2-propanol acetate, diethylene oxalate, dimethyl succinate, dimethyl glutarate, dimethyl adipate and mixtures thereof.

* * * * *